(12) United States Patent
Ozawa

(10) Patent No.: US 6,194,837 B1
(45) Date of Patent: Feb. 27, 2001

(54) DISPLAY DEVICE WITH THIN FILM TRANSISTOR (TFT) AND ORGANIC SEMICONDUCTOR FILM IN A LUMINESCENT ELEMENT

(75) Inventor: Tokuroh Ozawa, Suwa (JP)

(73) Assignee: Seiko Epson Corporation, Tokyo (JP)

( * ) Notice: Subject to any disclaimer, the term of this patent is extended or adjusted under 35 U.S.C. 154(b) by 0 days.

(21) Appl. No.: 09/242,927

(22) PCT Filed: Jul. 1, 1998

(86) PCT No.: PCT/JP98/02983

§ 371 Date: Feb. 26, 1999

§ 102(e) Date: Feb. 26, 1999

(87) PCT Pub. No.: WO99/01857

PCT Pub. Date: Jan. 14, 1999

(30) Foreign Application Priority Data

Jul. 2, 1997 (JP) .................................... 9-177454

(51) Int. Cl.[7] .................................................. G09G 3/10
(52) U.S. Cl. ..................... 315/169.1; 315/169.3; 313/506
(58) Field of Search .............. 315/169.1, 169.3; 313/495, 505, 506

(56) References Cited

U.S. PATENT DOCUMENTS 6,057,647 * 5/2000 Kurosawa et al. ................ 315/169.3

FOREIGN PATENT DOCUMENTS

| 7-57871 | 3/1995 | (JP) . |
| 8-227276 | 9/1996 | (JP) . |

OTHER PUBLICATIONS

Development of a Thin Film Transistor Circuit for a Luminescent Type Flat Panel Display, Makoto Ichihaa et al., Mitsubishi Kasei R&D Review, 1993, vol. 7, No. 2, pp. 79–82.

* cited by examiner

Primary Examiner—David Vu
(74) Attorney, Agent, or Firm—Oliff & Berridge, PLC

(57) ABSTRACT

The invention provides a display device in which parasitic capacitance associated with data lines and driving circuits is prevented using a bank layer whose primary purpose is to define areas on a substrate in which an organic semiconductor film is formed. When the organic semiconductor film for forming a luminescent element such as an electroluminescent element or an LED is formed is formed in pixel regions (7), the organic semiconductor film is formed in the areas surrounded by the bank layer (bank) formed of a black resist. The bank layer (bank) is also formed between an opposite electrode (op) and data lines (sig) for supplying an image signal to first TFTs (20) and holding capacitors (cap) in the pixel regions (7) thereby preventing parasitic capacitance associated with the data lines (sig).

21 Claims, 14 Drawing Sheets

DISPLAY DEVICE WITH THIN FILM TRANSISTOR (TFT) AND ORGANIC SEMICONDUCTOR FILM IN A LUMINESCENT ELEMENT

BACKGROUND OF THE INVENTION

1. Technical Field

The present invention relates to an active matrix display device in which driving of luminescent elements such as LEDs (light emitting diodes) or EL (electroluminescent) elements which emit light when a driving current is passed through an organic semiconductor film is controlled by thin film transistors (hereinafter referred to as TFTs). More specifically, the present invention relates to a technique of optimizing the layout to improve the display performance.

2. Description of Related Art

Active matrix display devices using current-controlled luminescent elements such as EL elements or LEDs have been proposed. Any types of luminescent elements used in display devices of this type have the capability of emitting light. Therefore, backlight is not required in display devices of this type unlike the liquid crystal display devices.

FIG. 13 is a block diagram illustrating an example of such an active matrix display device in which carrier injection type organic thin film EL elements are employed. The display device 1A shown in this figure includes various elements formed on a transparent substrate, such as a plurality of scanning lines "gate", a plurality of data lines "sig" extending in a direction crossing the direction in which the plurality of scanning lines "gate" extend, a plurality of common power supply lines "com" extending in a direction parallel to the data lines "sig", and pixel regions located at respective intersections of the data lines "sig" and the scanning lines "gate". To drive the data lines "sig", there is provided a data line driving circuit 3 including a shift register, level shifters, video lines, and analog switches. Similarly, to drive the scanning lines, there is provided a scanning line driving circuit 4 including a shift register and level shifters. Each pixel region 7 includes a first TFT 20 having a gate electrode to which a scanning signal is supplied via a scanning line, a holding capacitor "cap" for holding an image signal supplied from a data line "sig" through the first TFT 20, a second TFT 30 having a gate electrode to which the image signal held by the holding capacitor "cap" is supplied, and a luminescent element 40 into which a driving current flows when the luminescent element 40 is electrically connected to a common power supply line "com" via the second TFT 30.

In each pixel region, as shown in FIGS. 14(A) and 14(B), the first TFT 20 and the second TFT 30 are formed using two respective island-shaped semiconductor films wherein one of the source/drain regions of the second TFT 30 is electrically connected to an interconnecting electrode 35 via a contact hole formed in a first interlayer insulating film 51 and the interconnecting electrode 35 is electrically connected to a pixel electrode 41. At upper layers above the pixel electrodes 41, there are provided a hole injection layer 42, an organic semiconductor film 43, and an opposite electrode "op", which are formed in a multilayer structure. The opposite electrode "op" extends across the data lines "sig" and other lines over a plurality of pixel regions 7.

The other one of the source/drain regions of the second TFT 30 is electrically connected to the common power supply line "com" via a contact hole. On the other hand, in the first TFT 20, one of the source/drain regions is electrically connected to a potential sustaining electrode "st" which in turn is electrically connected to an extension 310 of the gate electrode 31. A semiconductor film 400, which is doped with an impurity so that it exhibits conductivity, is disposed below the extension 310 such that the semiconductor film 400 and the extension 310 face each other via a gate insulating film 50. As a result, a holding capacitor "cap" is formed with the extension 310, the gate insulating film 50, and the semiconductor film 400. The semiconductor film 400 is electrically connected to the common power supply line "com" via a contact hole formed in the first interlayer insulating film 51. The holding capacitor "cap" holds the image signal supplied from the data line "sig" via the first TFT 20 so that the gate electrode 31 of the second TFT 30 is maintained at a potential corresponding to the image signal even after the first TFT 20 is turned off. As a result, the driving current keeps flowing from the common power supply line "com" into the luminescent element 40 and thus the luminescent element 40 keeps emitting light.

However, in the display device described above, unlike liquid crystal display devices, the opposite electrode "op" opposing the pixel electrodes 41 is formed on the same transparent substrate 10 on which the pixel electrodes 41 are formed, such that the opposite electrode "op" extends over the entire surface of the transparent substrate 10 or over the plurality of pixel regions 7, and thus there is only a second insulating film 52 between the opposite electrode "op" and the data lines "sig". As a result, the data lines "sig" have a large parasitic capacitance which causes the data lines "sig" to have a large load. Similarly, a large parasitic capacitance is present between the opposite electrode and interconnection layers included in the data line driving circuit 3 or the scanning line driving circuit 4, because the opposite electrode "op" extends over the data line driving circuit 3 and the scanning line driving circuit 4. As a result, the data line driving circuit 3 also has a problem of a large load caused by the large parasitic capacitance.

SUMMARY OF THE INVENTION

The inventor of the present invention has developed a technique of forming an organic semiconductor film in a desired area by emitting a liquid material from an ink-jet head. The inventor has also developed a technique of defining an area where an organic semiconductor film is to be formed by surrounding the area by a bank layer so that the organic semiconductor film can be formed precisely in the defined area by means of the ink-jet technique without producing a part protruding outward from the defined area. Herein, the inventor presents a technique of solving the above-described problems using the above techniques.

That is, it is an object of the present invention to provide a display device including organic semiconductor films formed on a substrate, in particular areas defined by a bank layer thereby preventing data lines and driving circuits from having parasitic capacitance.

According to an aspect of the present invention, to achieve the above object, there is provided a display device comprising elements formed on a substrate, the elements including: a plurality of scanning lines; a plurality of data lines extending in a direction crossing the direction in which the scanning lines extend; a plurality of common power supply lines extending in a direction parallel to the data lines; and pixel regions formed in the shape of a matrix defined by the data lines and the scanning lines, each pixel region including: a first TFT having a gate electrode to which a scanning signal is supplied via one of the scanning lines; a holding capacitor for holding an image signal supplied from a corresponding data line via the first TFT; a second TFT having a gate electrode to which the image signal held by the holding capacitor is supplied; and a luminescent element including an organic semiconductor film formed between a pixel electrode provided in each pixel region and an opposite electrode extending across the data lines such that the opposite electrode faces the plurality of pixel electrodes, the luminescent element being adapted to emit light when the organic semiconductor film is driven by a driving current which flows between the pixel electrode and the opposite electrode when the pixel electrode is electrically connected to a corresponding common power supply line via the second thin film transistor, wherein light emitting areas of the organic semiconductor film are surrounded by a bank layer made up of an insulating film having a thickness greater than that of the organic semiconductor film, the bank layer being formed such that the data lines are, at least partly, covered with the bank layer.

In the present invention, because the opposite electrode is formed at least over the entire pixel regions or in the shape of stripes over a wide area, the opposite electrode faces the data lines. This can result in a large parasitic capacitance associated with each data line. However, in the present invention, the bank layer formed between the data lines and the opposite electrode prevents a large parasitic capacitance from occurring between the opposite electrode and the data lines. This results in a reduction in the load of the data line driving circuit. Therefore, it is possible to achieve a reduction in power consumption and an increase in the speed of displaying operation.

In the present invention, a first driving circuit for outputting the image signal over the data lines or a second driving circuit for outputting the scanning signal over the scanning lines may be formed, together with the plurality of pixel regions, on the substrate. If such a driving circuit is formed at a location facing the opposite electrode, the interconnection layer formed in the driving circuit also has a large parasitic capacitance. In the present invention, to avoid such a problem, the driving circuit is covered with the bank layer so as to prevent the driving circuit from having such a large parasitic capacitance with respect to the opposite electrode. This results in a reduction in the load of the driving circuit. As a result, a reduction in power consumption and an increase in the speed of displaying operation are achieved.

In the present invention, the organic semiconductor film may be a film formed, by means of an ink-jet technique, in areas surrounded by the bank layer, wherein the bank layer may be a water repellent film capable of preventing the organic semiconductor film from protruding outward from the above-described areas during the process of forming the organic semiconductor film by means of the ink-jet technique. In order to ensure that the organic semiconductor film is prevented from protruding outward, the bank layer may be formed to a thickness as large as about 1 $\mu$m. In this case, to achieve a good partition wall, the organic semiconductor film is not necessarily required to be water repellent.

In the present invention, it is desirable that an area of each pixel electrode overlapping the corresponding first thin film transistor or second thin film transistor be also covered with the bank layer. In the present invention, in those areas of the pixel electrodes overlapping the first thin film transistors or the second thin film transistors, even if a driving current is passed through the organic semiconductor film to the opposite electrode and light is emitted from the organic semiconductor film, the light is blocked by the first TFT or the second TFT, and thus such light emission does not make a contribution to displaying of an image. The driving current flowing in such a particular area of the organic semiconductor film which makes no contribution to the display is herein referred to as an useless current. In the present invention, the bank layer is formed in those areas where an useless current otherwise would occur so that no useless current flows in the areas. As a result, it becomes possible to reduce the current flowing through the common power supply lines. Thus, it is possible to reduce the width of the common power supply lines thereby increasing the light emitting areas. This allows an improvement in the displaying performance such as brightness and contrast.

In the present invention, the bank layer is preferably formed of a black resist film so that the bank layer also serves as a black matrix which results in an improvement in the displaying performance. In the display device according to the present embodiment, the opposite electrode is formed at least over the entire pixel regions or into the shape of stripes over a wide area, and thus light reflected by the opposite electrode can cause degradation in the contrast. In the present invention, the above problem is avoided by forming the bank layer of the black resist serving as a black matrix, which also serves to prevent parasitic capacitance. That is, the bank layer blocks light reflected from the opposite electrode and thus the contrast is improved.

In the present invention, the driving currents for driving the respective luminescent elements are passed through the common power supply lines and thus the magnitude of the current passed through each common power supply line is greater than that flowing through each data line. Therefore, in the present invention, it is desirable that the resistance of each common power supply line per unit length be smaller than the resistance of each data line per unit length so that the common power supply line has a large current capacity. For example, when the common power supply lines and the data lines are made of the same material and they have the same thickness, the common power supply lines preferably have a larger width than the data lines.

In the present invention, it is desirable that pixel regions be disposed at both sides of each common power supply line such that they are supplied with the driving current via this common power supply line, and furthermore, the data lines extend over the pixel regions on the sides opposite to the common power supply line. That is, elements are disposed into a pattern periodically repeated in the direction along the scanning lines wherein the unit pattern consists of a data line, pixels connected to that data line, a common power supply line, pixels connected to that common power supply line, and a data line supplying an image signal to those pixels. In this arrangement, only one common power supply line is required for every two lines of pixels. Compared to the case where one common power supply line is formed for each line of pixels, the total area needed for the common power supply lines becomes small. As a result, it becomes possible to increase the light emitting area and thus the displaying performance such as brightness and contrast is improved.

In the construction described above, because two data lines are located close to each other, crosstalk can occur between these two data lines. In the present invention, to avoid the above problem, an interconnection layer is preferably formed between these two data lines. In this arrangement in which another interconnection layer different from the two data lines is disposed between the two data lines, the crosstalk can be prevented simply by maintaining the interconnection layer at a constant voltage at least for one horizontal scanning period.

In the present invention, in the case where the organic semiconductor film is formed by means of the ink-jet technique, it is desirable that the center-to-center pitch of the organic semiconductor film areas be equal in any pixel regions arranged in the direction in which the scanning lines extend. In this case, it is simply required to emit an organic semiconductor material from an ink-jet head at equal intervals along the direction in which the scanning lines extend. This makes it possible to emit the organic semiconductor material exactly at specified points with a simple positioning control system.

DETAILED DESCRIPTION OF PREFERRED EMBODIMENT IN THE CLAIMS

The present invention is described in further detail below with reference to embodiments in conjunction with the accompanying drawings.

(General Construction of Active Matrix Substrate)

Figure 1:
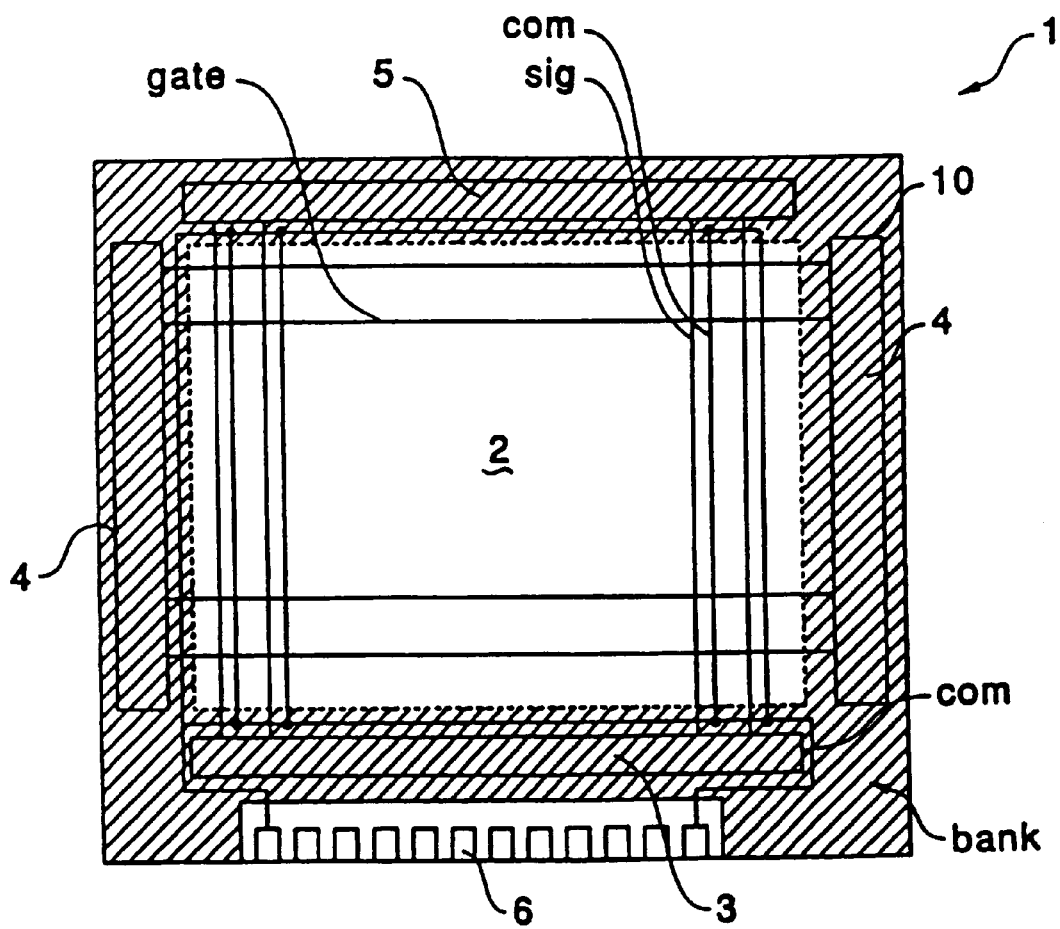
FIG. 1 is a schematic diagram illustrating a display device according to the present invention wherein an area where a bank layer is formed is also shown.

FIG. 1 is a block diagram schematically illustrating the general layout of a display device.

In the display device 1 according to the present embodiment, as shown in FIG. 1, a display area 2 is formed in the center of the surface of a transparent substrate 10 serving as a base member of the display device. In a peripheral area on the transparent substrate 10, a data line driving circuit 3 (first driving circuit) for outputting an image signal and a test circuit 5 are formed on respective sides at ends of data lines "sig", and scanning line driving circuits 4 (second driving circuits) for outputting a scanning signal are formed on respective sides at both ends of scanning lines ("gate"). In these driving circuits 3 and 4, a shift register, level shifters, and analog switches are formed using complementary TFTs each consisting of an n-type TFT and a p-type TFT. In a peripheral area on the transparent substrate 10, outside the data line driving circuit 3, there are formed mounting pads 6 serving as terminals for inputting an image signal, various voltages, and a pulse signal.

In the display device 1 with the above structure, as in the case of an active matrix substrate used in a liquid crystal display device, various elements are formed on the transparent substrate 10. They include a plurality of scanning lines "gate", a plurality of data lines "sig" extending in a direction crossing the direction in which the plurality of scanning lines "gate" extend, and a plurality of pixel regions 7 formed in the shape of a matrix defined by the data lines "sig" and the scanning lines "gate".

Figure 2:
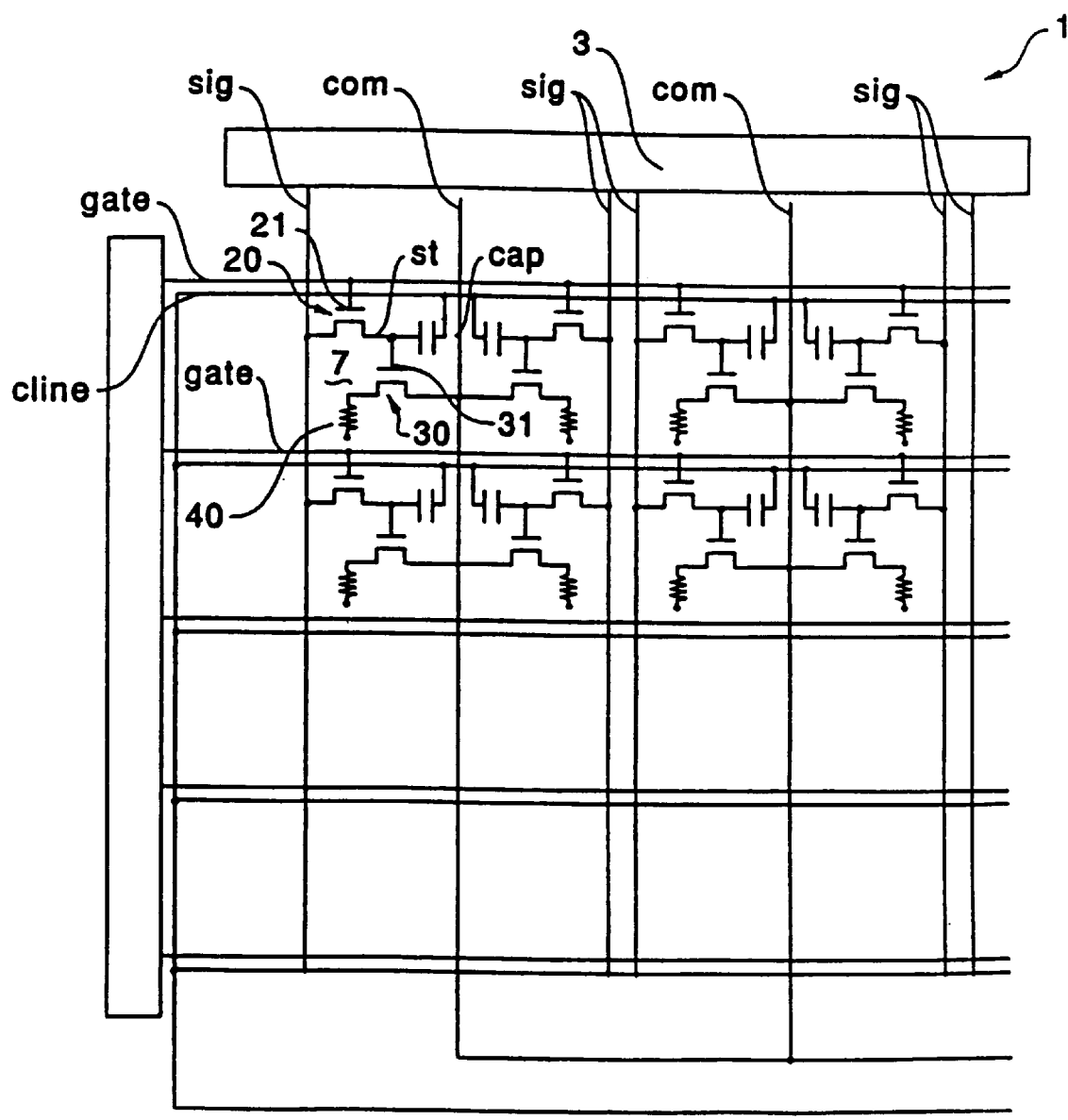
FIG. 2 is a block diagram of a display device according to the present invention.

As shown in FIG. 2, each pixel region 7 includes a first TFT 20 having a gate electrode 21 (first gate electrode) to which a scanning signal is supplied via a scanning line "gate". One of the source/drain regions of the TFT 20 is electrically connected to a data line "sig" and the other one is electrically connected to a potential sustaining electrode "st". Furthermore, capacitor lines "cline" are formed in a direction parallel to the scanning lines "gate" such that holding capacitors "cap" are formed between the respective capacitor lines "cline" and potential sustaining electrodes "st". Thus, when a first TFT 20 is selected and turned on by a scanning signal, an image signal is written into a holding capacitor "cap" from a data line "sig" via the first TFT 20.

The potential sustaining electrode "st" is electrically connected to the gate electrode 31 (second gate electrode) of a second TFT 30. One of the source/drain regions of the second TFT 30 is electrically connected to a common power supply line "com" whereas the other one is electrically connected to one electrode (pixel electrode, which will be described later) of a luminescent element 40. The common power supply line "com" is maintained at a constant voltage. Therefore, if the second TFT 30 turns on, an electric current flows from the common power supply line "com" into the luminescent element 40 via the second TFT 30 and thus the luminescent element 40 emits light.

In the present embodiment, one common power supply line "com" is disposed every two pixel regions 7 such that the common power supply line "com" is located at the boundary between these two pixel regions 7 each including a luminescent element 40 which receives a driving current from via the common power supply line "com". Each of these two pixel regions 7 has its own data line "sig" disposed on a side opposite to the common power supply line "com". That is, elements are disposed into a pattern periodically repeated in the direction along the scanning lines "gate" wherein the unit pattern consists of a data line "sig", pixels connected to that data line, a common power supply line "com", pixels connected to that common power supply line, and a data line "sig" supplying an image signal to those pixels. In this arrangement, one common power supply line "com" is used to supply a driving current to two lines of pixels. Therefore, compared to the case where one common power supply line "com" is formed for each line of pixels, the total area needed for the common power supply lines "com" becomes small. As a result, it becomes possible to increase the light emitting area and thus the displaying performance such as brightness and contrast is improved. In this construction, two columns of pixels are connected to one common power supply line "com" whereas two data lines "sig" extending in parallel are disposed close to each other such that an image signal is supplied from them to pixels in the respective columns.

(Construction of Pixel Regions)

The construction of each pixel region 7 of the display device 1 is described below with reference to FIGS. 3 to 6(A).

Figure 3:
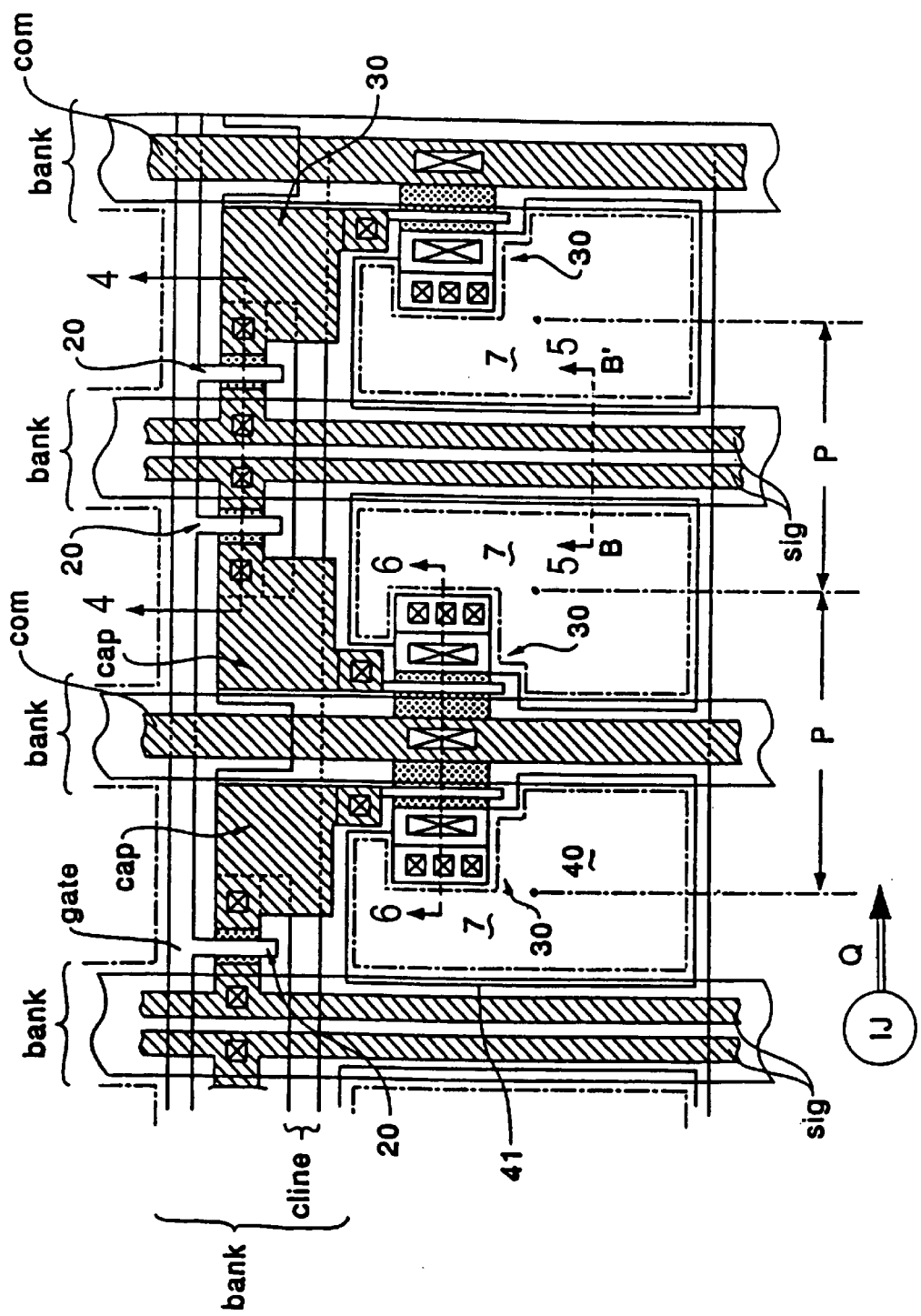
FIG. 3 is an enlarged plan view illustrating some pixel regions of the display device according to the present invention.
Figure 4:
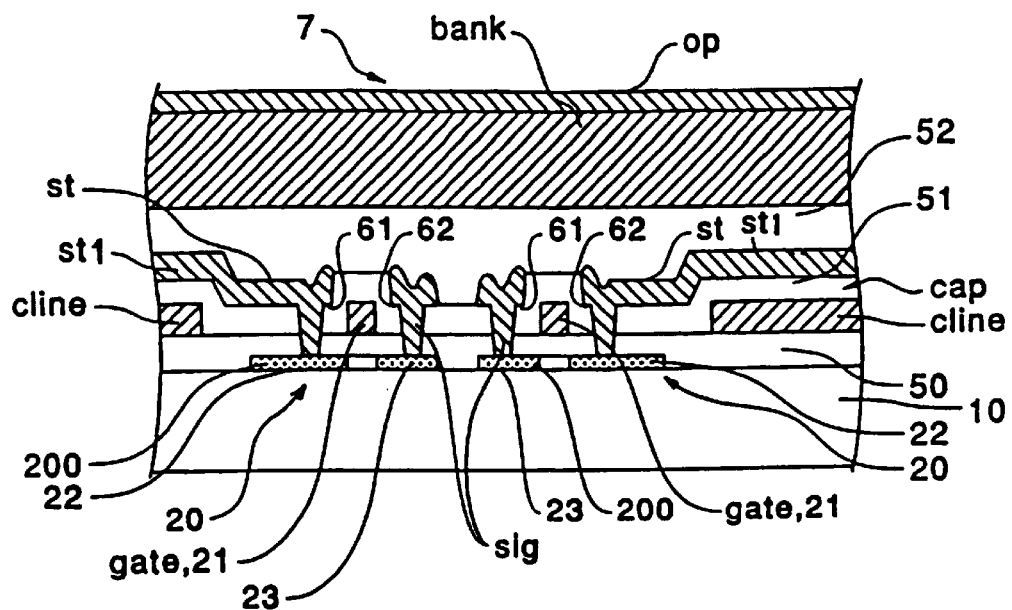
FIG. 4 is a cross-sectional view taken along line A–A' of FIG. 3.
Figure 5:
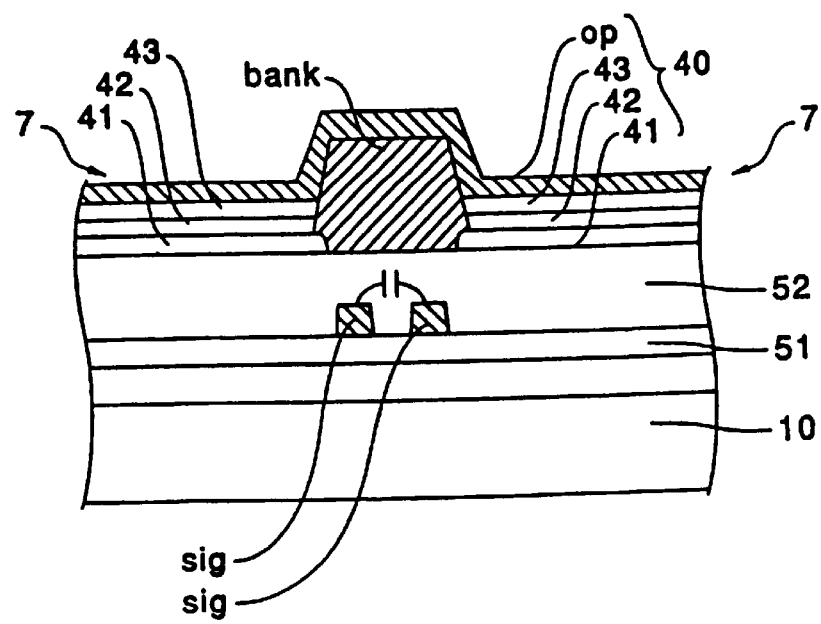
FIG. 5 is a cross-sectional view taken along line B–B' of FIG. 3.
Figure 6:
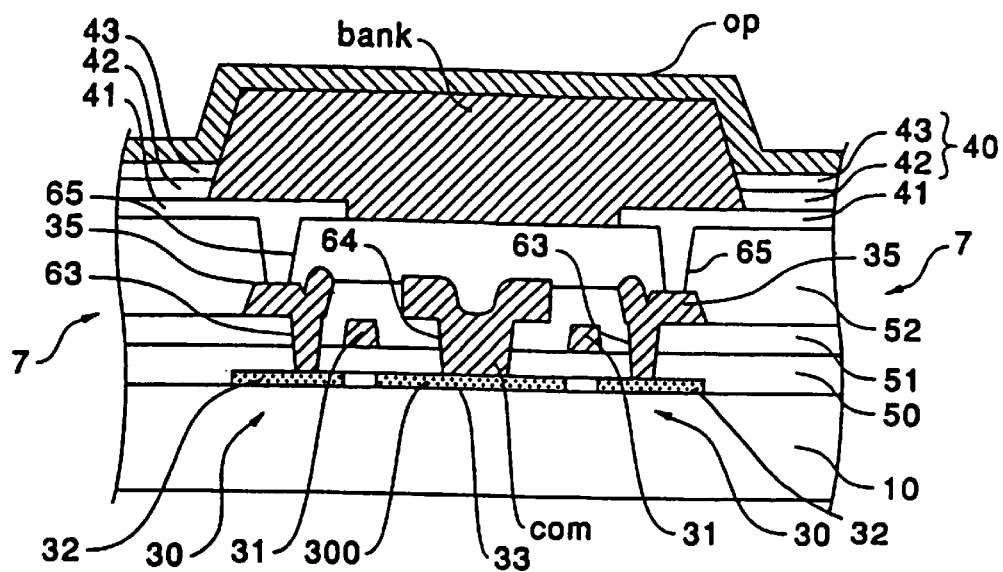
FIG. 6(A) is a cross-sectional view taken along line C–C' of FIG. 3.
FIG. 6(B) is a cross-sectional view illustrating a structure in which the bank layer is formed such that an interconnecting electrode is not covered with the bank layer.
Figure 6:
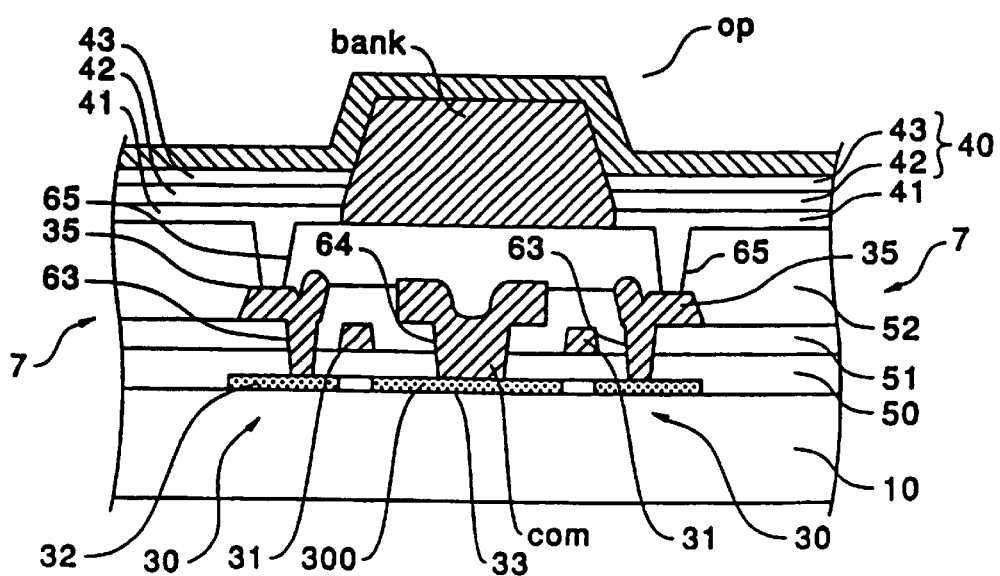

FIG. 3 is an enlarged plan view illustrating three pixel regions 7 of the plurality of pixels regions 7 formed in the display device 1 according to the present embodiment. FIGS. 4, 5, and 6(A) are cross-sectional views of FIG. 3, taken along lines A–A', B–B', and C–C', respectively.

At a location corresponding to line A–A' in FIG. 3, on the transparent substrate 10, an island-shaped silicon film 200 used to form the first TFT 20 is formed in each pixel region 7 and a gate insulating film 50 is formed on the surface of the silicon film 200, as shown in FIG. 4. A gate electrode 21 is formed on the surface of the gate insulating film 50. Source/drain regions 22 and 23 are formed by doping a high concentration of impurities in a self-aligned fashion with respect to the gate electrode 21. A first insulating film 51 is formed on the upper surface of the gate insulating film 50. The source/drain regions 22 and 23 are electrically connected to the data line "sig" and the potential sustaining electrode "st", respectively, via a contact hole 61 or 62 formed in the first insulating film 50.

A capacitor line "cline" is formed at the same layer where the scanning line "gate" and the gate electrode 21 are formed (that is, at the layer between the gate insulating film 50 and the first interlayer insulating film 51) in each pixel region 7 such that the capacitor line "cline" extends in a direction parallel to the scanning line "gate". An extension "st1" of the potential sustaining electrode "st" is formed such that it overlaps the capacitor line "cline" via the first interlayer insulating film 51. As a result, a holding capacitor "cap" is formed between the capacitor line "cline" and the extension "st1" of the potential sustaining electrode "st" wherein the first insulating film 51 serves as the dielectric film of the holding capacitor "cap". A second insulating film 52 is formed at a layer above the potential sustaining electrode "st" and the data line "sig".

At a location corresponding to line B–B' in FIG. 3, two data lines "sig" used by respective pixel regions 7 are formed close to each other and in parallel to each other, as shown in FIG. 5, at a layer on the first interlayer insulating film 51 formed on the transparent substrate 10 and on the second interlayer insulating film 52.

At a location corresponding to line C–C' in FIG. 3, an island-shaped silicon film 300 used to form the second TFT 30 is formed, as shown in FIG. 6(A), on the transparent substrate 10 such that the silicon film 300 extends over two pixel regions 7 across a common power supply line "com" located between these two pixel regions 7. A gate insulating film 50 is formed on the surface of the silicon film 300. Gate electrodes 31 are formed in the respective two pixel regions 7, on the surface of the gate insulating film 50, such that the gate electrodes 31 are located at both sides of the common power supply line "com". Source/drain regions 32 and 33 are formed by doping a high concentration of impurities in a self-aligned fashion with respect to the gate electrodes 31. A first interlayer insulating film 51 is formed at a layer on the gate insulating film 50. Interconnecting electrodes 35 are electrically connected to the source/drain regions 62 via contact holes 63 formed in the first interlayer insulating film 51. On the other hand, the part of the silicon film 300 which will be a common source/drain region 33 at the center of two pixel regions 7 is electrically connected to the common power supply line "com" via a contact hole 64 formed in the first interlayer insulating film 51. A second interlayer insulating film 52 is formed at a layer over the surface of the common power supply line "com" and also over the surface of the interconnecting electrodes 35. ITO films serving as pixel electrodes 41 are formed on the surface of the second interlayer insulating film 52. The pixel electrodes 41 are electrically connected to the respective interconnecting electrodes 35 via contact holes 65 formed in the second interlayer insulating film 52 and further electrically connected to the respective source/drain regions 32 of the second TFTs 30 via the interconnecting electrodes 35.

Each pixel electrode 41 serves as one of electrodes of a corresponding luminescent element 40. That is, a hole injection layer 42 and an organic semiconductor film 43 are formed in a multilayer fashion on the surface of the pixel electrodes 41, and a metal film of aluminum containing lithium or of calcium serving as an opposite electrode "op" is formed on the surface of the organic semiconductor film 43. The opposite electrode "op" is formed at least over the entire areas of all pixel regions 41 or formed in a stripe shape such that it serves as a common electrode maintained at a constant voltage.

Figure 7:
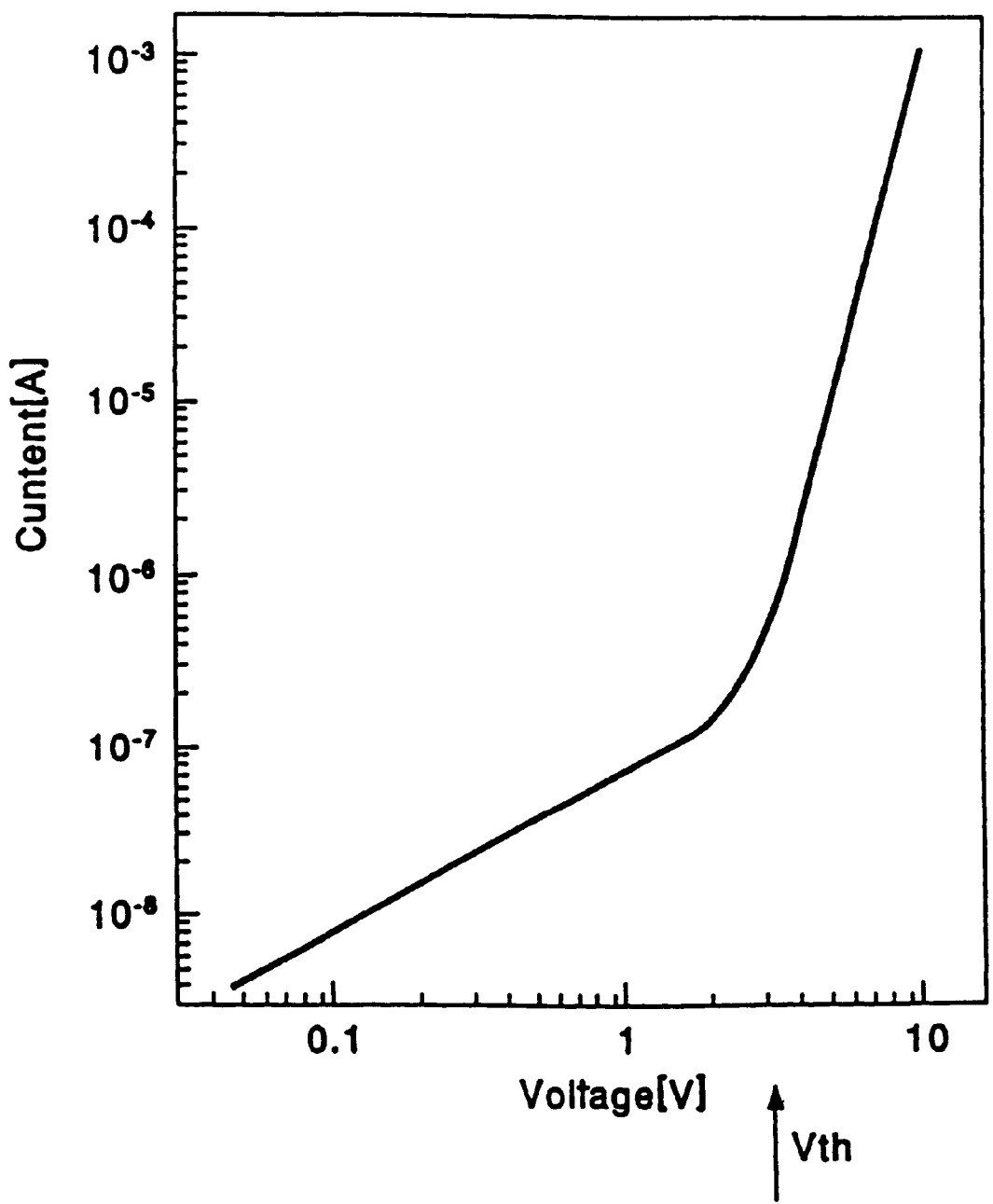
FIG. 7 is a graph illustrating the I-V characteristic of a luminescent element used in the display device shown in FIG. 1.

In each luminescent element 40 constructed in the above-described fashion, a voltage is applied between the opposite electrode "op" and the pixel electrode 41 serving as positive and negative electrodes, respectively. If the applied voltage becomes greater than a threshold voltage, the current (driving current) flowing through the organic semiconductor film 43 increases abruptly, as shown in FIG. 7. As a result, the luminescent element 40 acts as an electroluminescent element or an LED and emits light. The light emitted from the luminescent element 40 is reflected by the opposite electrode "op" and output to the outside via the transparent pixel electrode 41 and the transparent substrate 10.

The driving current for emission of light is passed through a current path consisting of the opposite electrode "op", the organic semiconductor film 43, the hole injection layer 42, the pixel electrode 41, the second TFT 30, and the common power supply line "com". Therefore, if the second TFT 30 is turned off, the driving current stops flowing. However, in the display device 1 according to the present embodiment, when a first TFT 20 is selected and turned on by a scanning signal, an image signal is written into a holding capacitor "cap" from a data line "sig" via the first TFT 20. As a result, the gate electrode of the second TFT 30 is held by the holding capacitor "cap" at a voltage corresponding to the image signal even after the first TFT 20 is turned off, and thus the second TFT 30 is maintained in the on-state. As a result, the driving current keeps flowing through the luminescent element 40 and the corresponding pixel keeps emitting light. This state is maintained until the second TFT 30 is turned off after new image data is written into the holding capacitor "cap".

(Method of Producing Display Device)

In the process of producing the display device 1 having the above-described structure, the steps from the beginning until the first TFTs 20 and the second TFTs 30 are formed on the transparent substrate 10 are similar to the steps of producing an active matrix substrate for use in a liquid crystal display device 1. The outline of the production process is described below with reference to FIG. 8.

FIG. 8 is a cross-sectional view illustrating the steps of producing various parts of the display device 1.

Figure 8A:
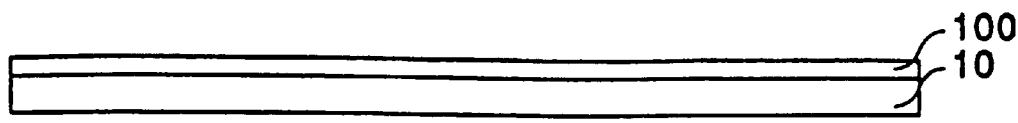
FIGS. 8(A)–8(G) are a cross-sectional view illustrating the steps of producing the display device according to the present invention.

First, as shown in FIG. 8(A), a silicon oxide film serving as an underlying protective film (not shown) with a thickness of about 2000 to 5000 A is formed on a transparent substrate 10 by means of a plasma CVD technique using source gases such as TEOS (tetraethoxysilane) and oxygen as required. Then the temperature of the substrate is set to about 350° C., and a semiconductor film 100 of amorphous silicon with a thickness of about 300 to 700 A is formed on the surface of the underlying protective film by means of plasma CVD. The semiconductor film 100 of amorphous silicon is then crystallized by means of laser annealing or solid phase growth so as to convert the semiconductor film 100 into a polysilicon film. The laser annealing may be performed for example using an excimer laser line beam with a longer side length of 400 mm with an output power of for example 200 mJ/cm$^2$. The line beam is scanned such that adjacent scanned lines have an overlap at 90% of peak power along the shorter sides of the laser beam.

Figure 8B:
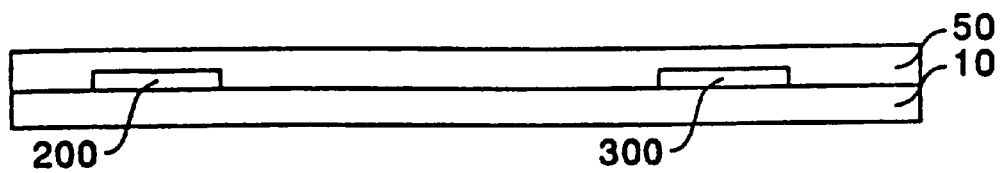

The semiconductor film 100 is patterned into islands 200 and 300 of semiconductor film, as shown in FIG. 8(B). Subsequently, a silicon oxide film or a silicon nitride film with a thickness of about 600 to 1500 A serving as a gate insulating film 50 is formed by means of a plasma CVD process using TEOS (tetraethoxysilane) and oxygen as source gases.

Figure 8C:
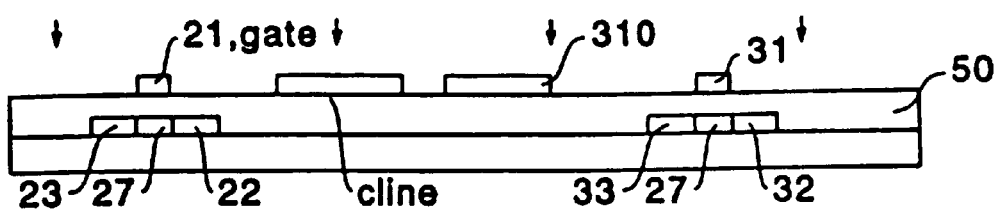

After that, as shown in FIG. 8(C), a conductive film is formed by sputtering metal such as aluminum, tantalum, molybdenum, titanium, or tungsten. The conductive film is then patterned so as to form gate electrodes 21 and 31 (gate electrode formation step). In this step, scanning lines "gate" and capacitor lines "cline" are also formed. In FIG. 8(C), reference numeral 310 denotes an extension of the gate electrode 31.

Subsequently, a high concentration of phosphorus ions are implanted so that source/drain regions 22, 23, 32, and 33 are formed in the thin silicon films 200 and 300 in a self-aligned fashion with respect to the gate electrodes 31 and 31. The parts where no impurities are implanted in this step become channel regions 27 and 37.

Figure 8D:
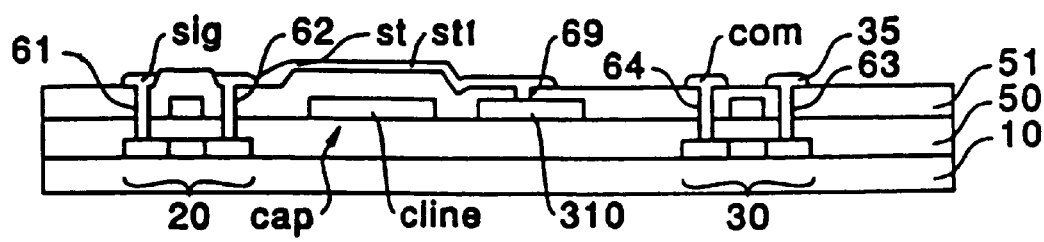

After that, as shown in FIG. 8(D), a first interlayer insulating film 51 is formed and then contact holes 61, 62, 63, 64, and 69 are formed therein. Furthermore, data lines "sig", capacitor lines "cline", potential sustaining electrodes "st" including extensions "st1" overlapping extensions 310 of the gate electrodes 31, common power supply lines "com", and interconnecting electrodes 35 are formed. As a result, the potential sustaining electrodes "st" are electrically connected to the corresponding gate electrodes 31 via corresponding contact holes 69 and extensions 310. Thus, the first TFTs 20 and the second TFTs 30 are obtained. Furthermore, the holding capacitors "cap" are formed between the respective capacitor lines "cline" and the extensions "st1" of the potential sustaining electrodes "st".

Figure 8E:
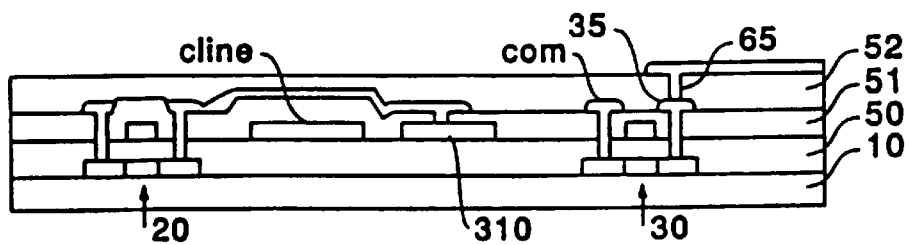

After that, as shown in FIG. 8(E), a second insulating film 52 is formed and then contact holes 65 are formed in this second insulating film 52, at locations corresponding to the interconnecting electrodes 35. Subsequently, an ITO film is formed over the entire surface of the second insulating film 52. The ITO film is then patterned so as to form pixel electrodes electrically connected to source/drain regions 32 of the corresponding second TFTs 30 via contact holes 65.

Figure 8F:
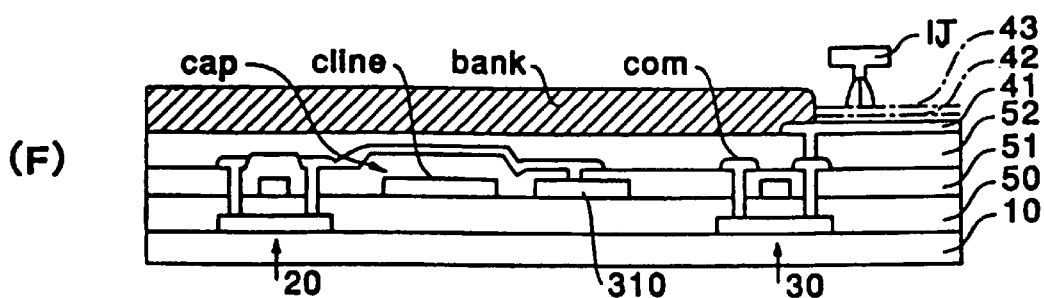

Then, as shown in FIG. 8(F), a black resist layer is formed on the surface of the second interlayer insulating film 52. The resist layer is then patterned into the shape of the bank layer "bank" surrounding the light emitting areas where the hole injection layers 42 and the organic semiconductor films 43 of the respective luminescent elements 40 will be formed. Herein, the organic semiconductor films 43 may be formed in the form of, for example, isolated boxes in the respective pixels or in the form of stripes extending along the data lines "sig". In any case, it is simply required to form the bank layer "bank" into the corresponding shape according to the production method of the present embodiment.

Then a liquid material (precursor) for forming the hole injection layers 42 is emitted from an ink-jet head IJ into the inner areas surrounded by the bank layer "bank" thereby forming the hole injection layers 42 in the inner areas surrounded by the bank layer "bank". Similarly, a liquid material (precursor) for forming the organic semiconductor films 43 is emitted from the ink-jet head IJ into the inner areas surrounded by the bank layer "bank" thereby forming the organic semiconductor films 43 in the inner areas surrounded by the bank layer "bank". Because the bank layer is formed of the resist, the bank layer is water repellent. On the other hand, the precursor of the organic semiconductor films 43 is in the form of a hydrophilic solvent. This ensures that the organic semiconductor films 43 are deposited only within the areas defined by the bank layer "bank" without producing a part protruding into an adjacent pixel. This technique makes it possible to form the organic semiconductor films 43 or the like only in desired areas. However, in the case where the bank layer "bank" is formed to have partition walls as high as about 1 µm, the partitions walls of the back layer "bank" can work well even if the bank layer "bank" is not water repellent. Furthermore, the bank layer "bank" may also be used to define the areas where the hole injection layers 42 and the organic semiconductor films 43 are formed by means of a coating technique instead of the ink-jet technique.

In the present embodiment, in the case where the organic semiconductor film 43 and the hole injection layer 42 are formed by means of the ink-jet technique, the center-to-center pitch P of the areas where the organic semiconductor film 43 is formed is set to an equal value over the all pixel areas 7 arranged in the direction along the scanning lines "gate" as shown in FIG. 3 thereby achieving high productivity. In this case, it is simply required to emit a material for the organic semiconductor film 43 from the ink-jet head IJ at equal intervals along the direction, denoted by an arrow Q, in which the scanning lines "gate" extend. Thus, high productivity can be achieved. Because the requirement for the ink-jet head IJ is only to move at equal intervals, high emission accuracy can be achieved using a simple mechanism for moving the ink-jet head IJ.

Figure 8G:
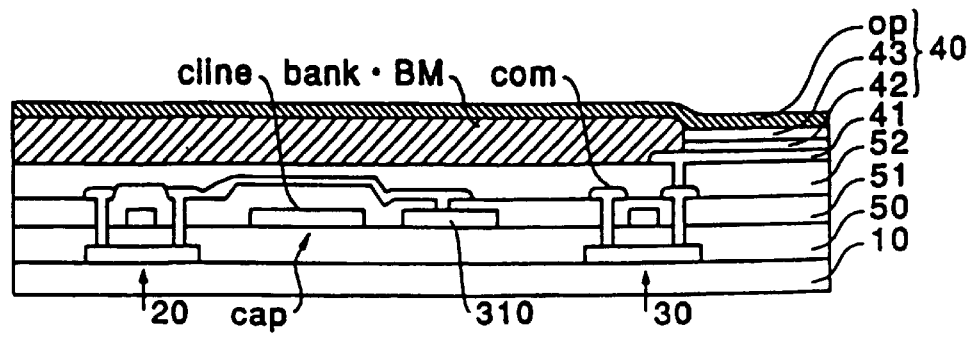

After that, as shown in FIG. 8(G), the opposite electrode "op" is formed on the entire area of the surface of the transparent substrate 10 or into the shape of stripes. The bank layer "bank" made of the black resist is left in place so that it serves as a black matrix BM and also as an insulating layer for reducing the parasitic capacitance.

TFTs are also formed in the data line driving circuit 3 and the scanning line driving circuit 4 shown in FIG. 1 wherein these TFTs may be formed using all or part of the above-described processing steps used to form the TFTs in the pixel areas. Therefore, the TFTs in the driving circuits are formed in the same layer where the TFTs in the pixel regions 7 are formed.

Both the first TFTs 20 and the second TFTs 30 may be of either the N-type or P-type. Otherwise, either the first TFTs 20 or the second TFTs 30 may be of the N-type and the other may be of the P-type. In any case, the TFTs may be produced using a known technique and thus the production method of the TFTs is not described in further detail herein.

In the luminescent elements 40, the hole injection layer 42 may be removed although the luminous efficiency slightly decreases. When an electron injection layer is formed instead of the hole injection layer 42 on the organic semiconductor film 43 on the side opposite to the hole injection layer 42, both the hole injection layer 42 and the electron injection layer may be formed.

(Area where Bank Layer is Formed)

In the present embodiment, the above-described bank layer "bank" is formed over the entire peripheral area (diagonally shaded area in FIG. 1) on the transparent substrate 10 shown in FIG. 1. As a result, the data driving circuit 3 and the scanning line driving circuit 4 are covered with the bank layer "bank". Therefore, when the opposite electrode "op" is formed such that it extends over the area where the driving circuits are formed, the bank layer "bank" is present between the opposite electrode "op" and the interconnection layers in the driving circuits. As a result, the driving circuits 3 and 4 are prevented from having parasitic capacitance. This results in a reduction in the load of the driving circuits 3 and 5, and thus a reduction in power consumption and an increase in the speed of displaying operation are achieved.

Furthermore, in the present embodiment, as shown in FIGS. 3 to 5, the bank layer "bank" is formed such that it extends over the data lines "sig" and thus the bank layer "bank" is also present between the opposite electrode "op" and the data lines "sig". As a result, the data lines "sig" are prevented from having parasitic capacitance. This results in a reduction in the load of the data line driving circuit 3. Therefore, it is possible to achieve a reduction in power consumption and an increase in the speed of displaying operation.

Furthermore, in the present embodiment, as shown in FIGS. 3, 4, and 6(A), the bank layer "bank" is also formed such that the area of each pixel electrode 41 overlapping the interconnecting electrode 31 is covered with the bank layer "bank". If there were no bank layer "bank" in this area overlapping the interconnecting electrode 35 as shown in FIG. 6(B), a driving current would flow in this area between the opposite electrode "op" and the pixel electrode 41 and the organic semiconductor film 43 in this area would emit light. However, the light emitted from such an area would be confined between the interconnecting electrode 35 and the opposite electrode "op" and it would not be emitted to the outside. As a result, the light would not make any contribution to displaying of an image. Thus, such a driving current is useless.

In the present embodiment, to avoid such a problem, the bank layer "bank" is formed in the area where a useless current would otherwise flow so that the driving current is prevented from flowing in this area. This also prevents the useless current from flowing through the common power supply lines "com". Therefore, it is possible to reduce the width of the common power supply line "com" by an amount corresponding to the reduction in the current. In the present embodiment, the power supply lines "com", unlike the data lines "sig", are required to carry a large current for driving the luminescent elements 40. That is, each common power supply line "com" is required to supply a driving current to two lines of pixels. To this end, the common power supply lines "com" are formed using the same material as that of the data lines "sig" but they have a width greater than the width of the data lines "sig" so that the resistance of the common power supply lines "com" per unit length becomes lower than the resistance of the data lines "sig" per unit length. In the present embodiment, because the useless current is prevented from flowing through the common power supply lines "com" as described earlier, the width of the common power supply lines "com" may be reduced to a minimum required level. This allows the light emitting area of the pixel regions 7 to be increased. Thus, the display performance such as the brightness and the contrast can be improved.

When the bank layer "bank" is formed in the above-described fashion, the bank layer "bank" may serve as a black matrix which results in an improvement in the display performance such as the contrast. In the display device 1 according to the present embodiment, because the opposite electrode "op" is formed on the transparent substrate 10 over the entire pixel regions 7 or into the shape of stripes over a wide area, light reflected by the opposite electrode "op" can degrade the contrast. In the present embodiment, to avoid the above problem, the bank layer is formed of the black resist so that it serves as the black matrix which blocks light reflected from the opposite electrode "op" and thus the contrast is improved, wherein the bank layer also serves to prevent the parasitic capacitance.

[Improved Embodiment]

Figure 9:
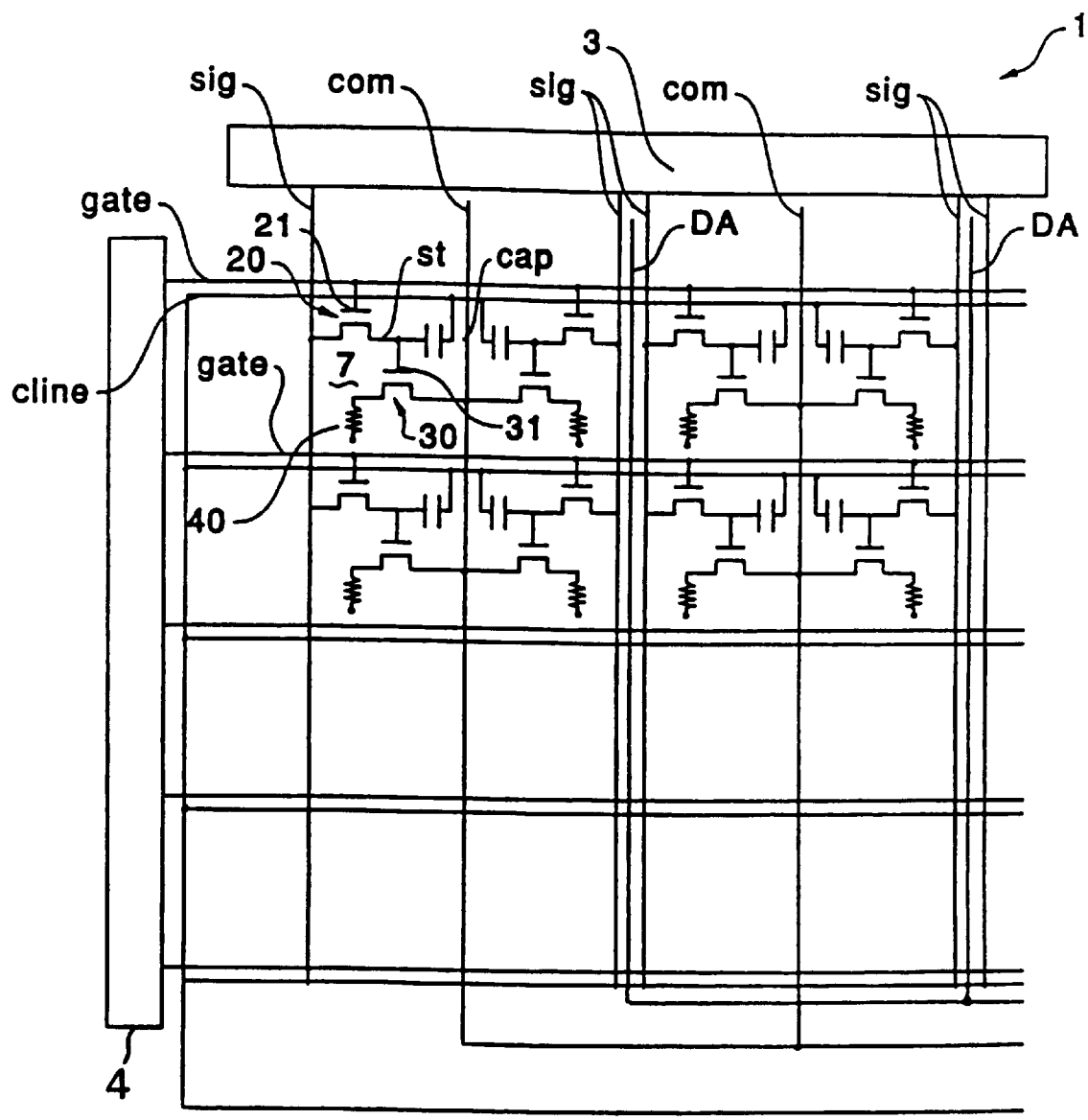
FIG. 9 is a block diagram illustrating an improved embodiment of a display device based on the display device shown in FIG. 1.
Figure 10A:
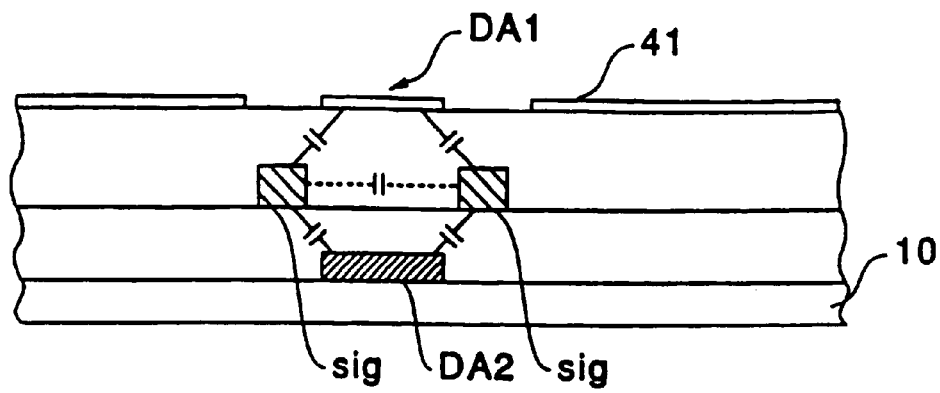
FIG. 10(A) is a cross-sectional view illustrating a dummy interconnection layer formed in the display device shown in FIG. 9.
Figure 10:
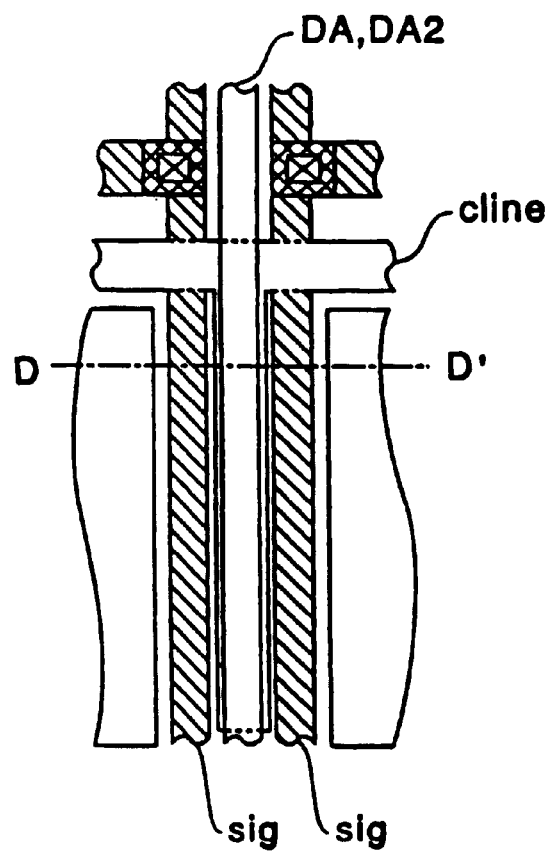
FIG. 10(B) is a plan view thereof.

In the embodiments described above, one common power supply line "com" is formed for every two lines of pixel regions 7 such that the common power supply line "com" is located at the center of the two lines of pixel regions and such that pixel regions 7 at both sides of the common power supply line "com" are supplied with the driving current via that common power supply line "com". Furthermore, in the embodiments described above, two data lines "sig" are formed at locations which are close to each other such that they extend over the pixel areas 7 on the side opposite to the common power supply line "com". In this structure, crosstalk can occur between the two data lines "sig". In an improved embodiment, to avoid the above problem, a dummy interconnection layer DA is formed between the two data lines "sig" as shown in FIG. 9 and FIGS. 10A and 10(B). The dummy interconnection layer DA may be realized using, for example, an ITO film DA1 formed at the same time as the pixel electrodes 41. Alternatively, the dummy interconnection layer DA may be realized using an extension DA2 formed by extending the capacitor line "cline" into the area between the two data lines "sig". Furthermore, both may be employed as the dummy interconnection layer DA.

In the above arrangement in which another interconnection layer different from the two data lines "sig" located close to each other is disposed between the two data lines "sig", the crosstalk can be prevented simply by maintaining the interconnection layer DA (DA1, DA2) at a constant voltage at least for one horizontal scanning period. Whereas the first interlayer insulating film 51 and the second interlayer insulating film 52 have a thickness of about 1.0 $\mu$m, the spacing between the two data lines "sig" is about 2 $\mu$m or greater. Therefore, the capacitance between the two data lines "sig" is negligibly small compared to the capacitance between the dummy interconnection layer DA (DA1, DA2) and either data line "sig". As a result, a high-frequency leakage signal from the data lines "sig" is absorbed by the dummy interconnection layer DA and thus the crosstalk between the two data lines "sig" is prevented.

(Further Embodiments)

Although in the embodiments described above, the holding capacitors "cap" are formed using the capacitor lines "cline" (capacitor electrodes), the holding capacitors "cap" may also be formed using the polysilicon film used to form the TFTs as described earlier with reference to the conventional technique.

Figure 11:
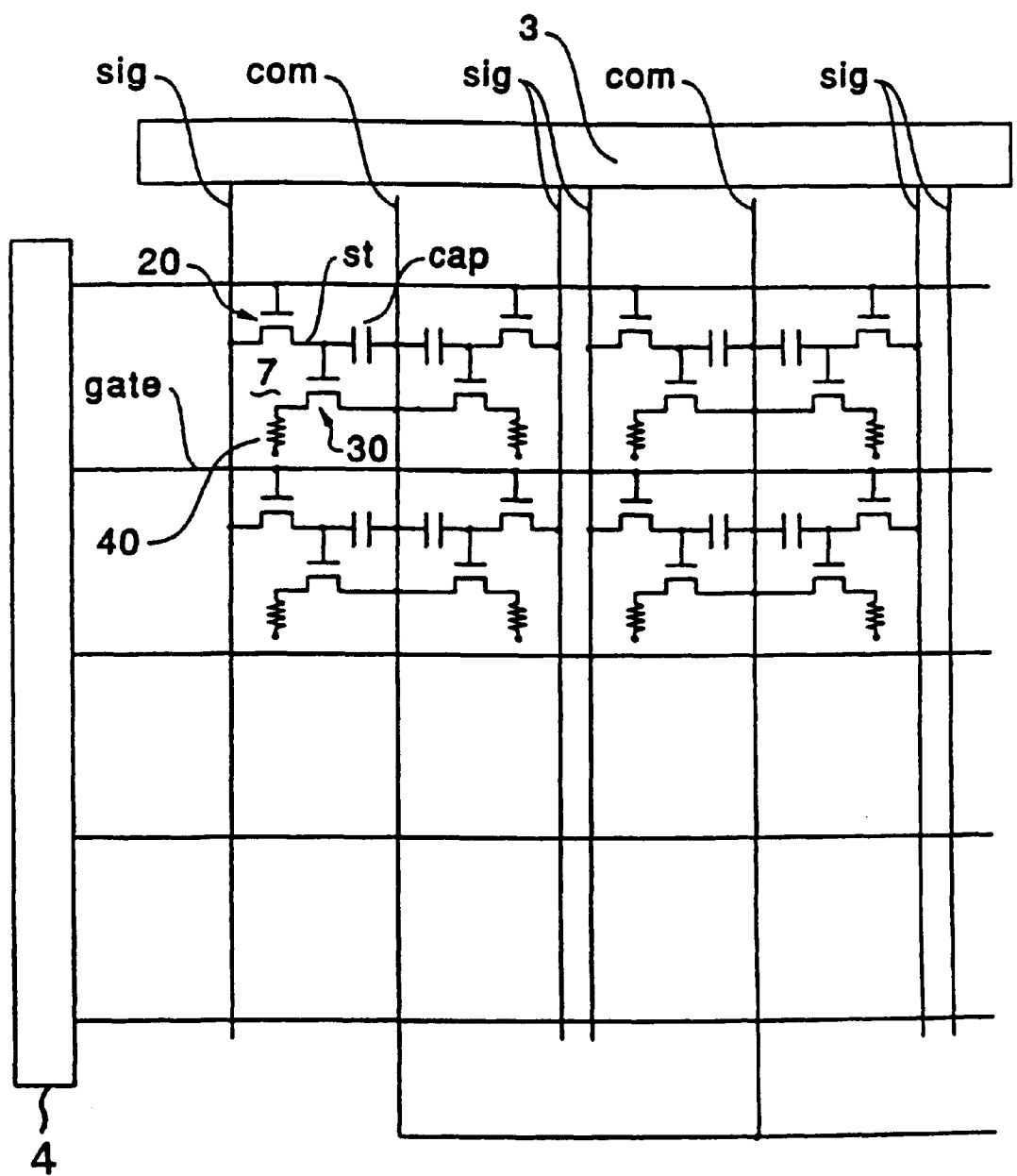
FIG. 11 is a block diagram illustrating a modification of the display device shown in FIG. 1.
Figure 12A:
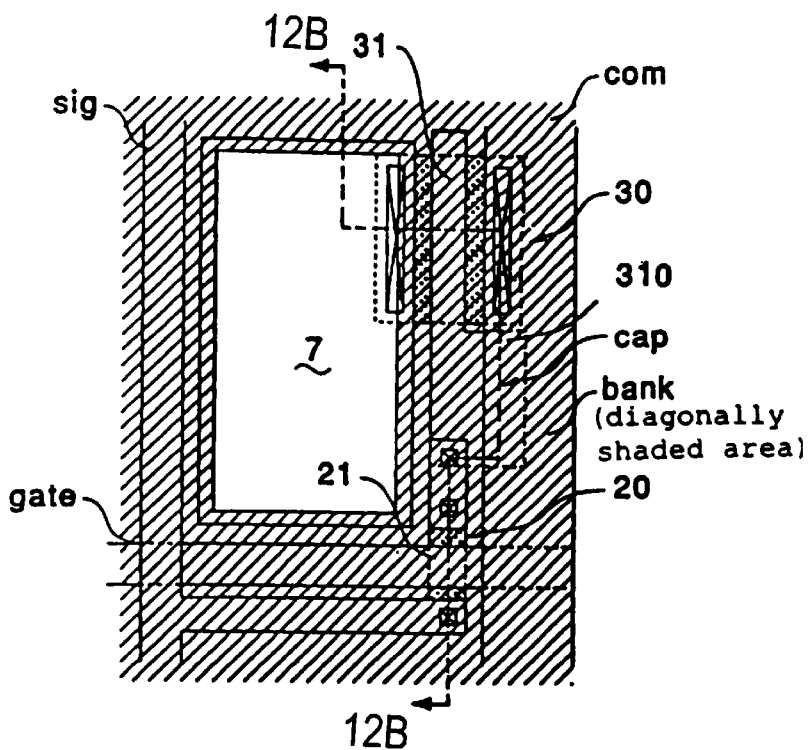
FIG. 12(A) is an enlarged plan view illustrating a pixel region formed on the display device shown in FIG. 11.
Figure 12B:
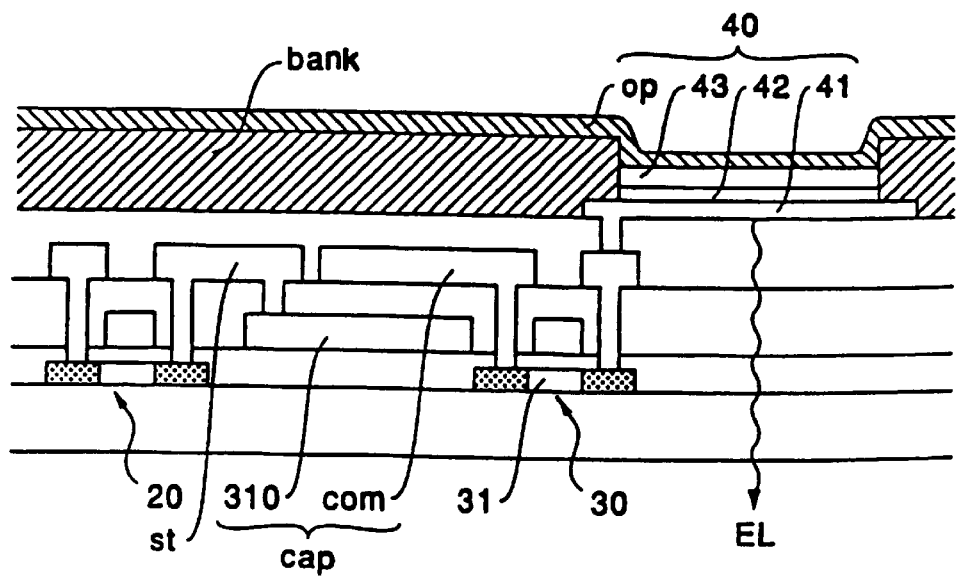
FIG. 12(B) is a cross-sectional view thereof.
Figure 13:
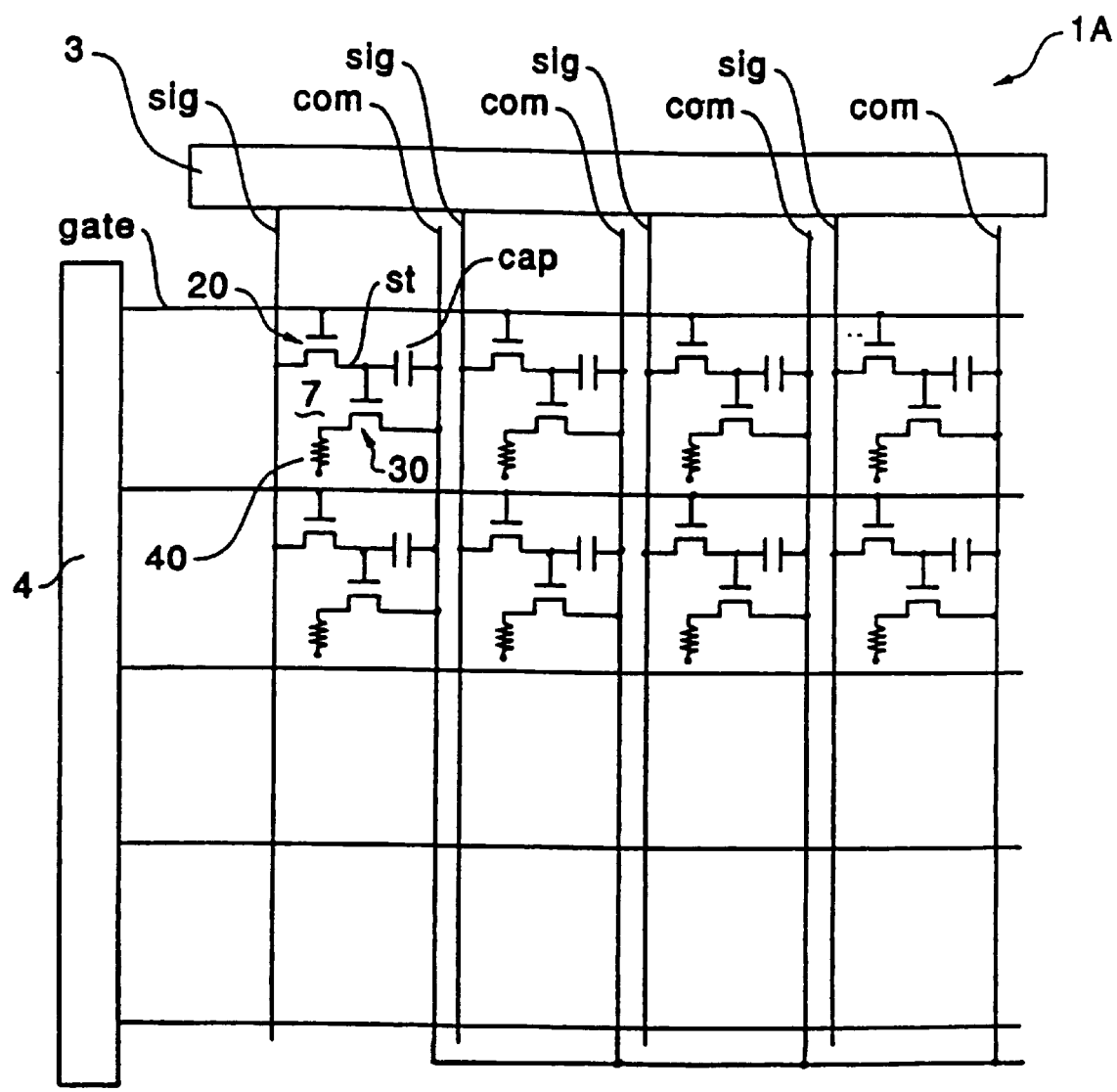
FIG. 13 is a block diagram illustrating a conventional display device.
Figure 14:
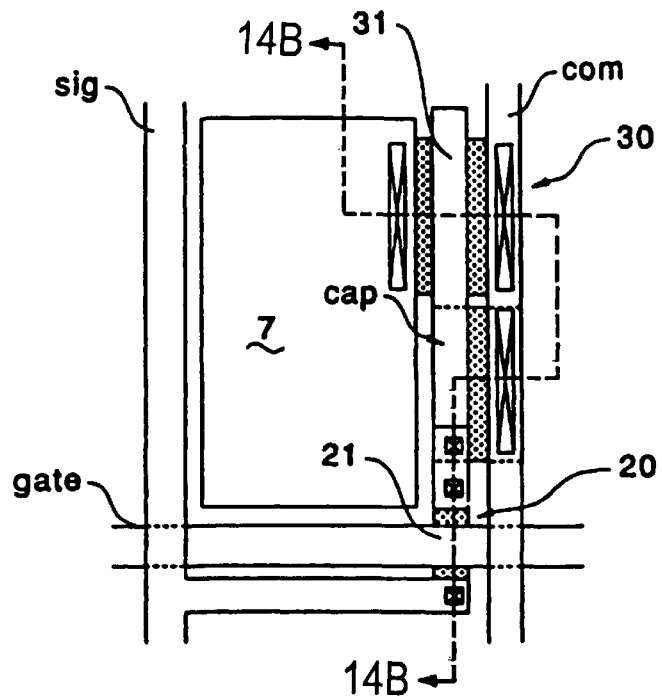
FIG. 14(A) is an enlarged plan view illustrating a pixel region formed on the display device shown in FIG. 13.
FIG. 14(B) is a cross-sectional view thereof.
Figure 14:
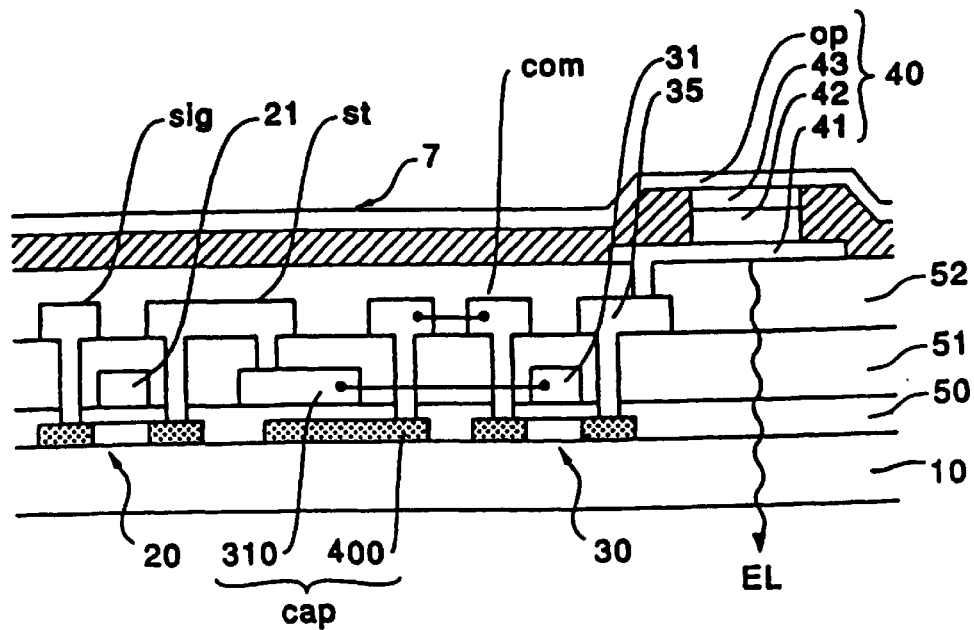

The holding capacitors "cap" may also be formed between the common power supply lines "com" and the potential sustaining electrodes "st" as shown in FIG. 11. In this case, as shown in FIGS. 12(A) and 12(B), the extension 310 of each gate electrode 31 for electrically connecting the gate electrode 31 to the corresponding potential sustaining electrode "st" is extended to a location under the corresponding common power supply line "com" so that the holding capacitor "cap" is formed between the extension 310 and the common power supply line "com" wherein the first interlayer insulating film 51 serves as the dielectric film of the holding capacitor "cap".

Industrial Applicability

As described above, the display device according to the present invention is characterized in that the insulating bank layer for defining the areas where the organic semiconductor films of the luminescent elements are formed is also formed between the opposite electrode and the data lines or between the opposite electrode and the driving circuits. This makes it possible to prevent parasitic capacitance associated with data lines and interconnection layers in driving circuits even when there is an overlap between the opposite electrode and the data lines or the driving circuits. As a result, the loads of the driving circuits are reduced. Furthermore, it becomes possible to deal with an image signal at higher frequencies.

What is claimed is:

1. A display device comprising elements formed on a substrate, said elements including:
    a plurality of scanning lines;
    a plurality of data lines extending in a direction crossing a direction in which said scanning lines extend;
    a plurality of common power supply lines extending in a direction parallel to said data lines; and
    pixel regions formed in the shape of a matrix defined by said data lines and said scanning lines, each of said pixel regions including:
        a first thin film transistor having a first gate electrode to which a scanning signal is supplied via one of the scanning lines;
        a holding capacitor for holding an image signal supplied from a corresponding data line via said first thin film transistor;
        a second thin film transistor having a second gate electrode to which said image signal held by said holding capacitor is supplied; and
        a luminescent element including an organic semiconductor film formed between a pixel electrode provided in each of said pixel regions and an opposite electrode extending across the data lines such that said opposite electrode faces the plurality of pixel electrodes, said luminescent element being adapted to emit light when said organic semiconductor film is driven by a driving current which flows between said pixel electrode and said opposite electrode when said pixel electrode is electrically connected to a corresponding common power supply line via said second thin film transistor,
    light emitting areas of said organic semiconductor film being surrounded by a bank layer made up of an insulating film having a thickness greater than that of said organic semiconductor film, said bank layer being formed such that said data lines are, at least partly, covered with said bank layer.

2. The display device according to claim 1, further comprising at least one of a first driving circuit for outputting said image signal over said data lines and a second driving circuit for outputting said scanning signal over said scanning lines, and said at least one of said driving circuits being covered with said bank layer.

3. The display device according to claim 1, said organic semiconductor film being formed by means of an ink-jet technique in the areas surrounded by said bank layer, and said bank layer being a water repellent film.

4. The display device according to claim 1, said organic semiconductor film being formed by means of an ink-jet technique in the areas surrounded by said bank layer, and said bank layer having a thickness equal to or greater than 1 $\mu$m.

5. The display device according to claim 1, an area of each said pixel electrode overlapping the corresponding first thin film transistor or second thin film transistor being covered with said bank layer.

6. The display device according to claim 1, said bank layer being formed of a black resist film.

7. The display device according to claim 1, a resistance of said common power supply lines per unit length being smaller than a resistance of said data lines per unit length.

8. The display device according to claim 1, said common power supply lines and said data lines being made of a same material and having a same thickness and a width of said common power supply lines being greater than a width of said data lines.

9. The display device according to claim 1, pixel regions located at both sides of each of said common power supply lines being supplied with said driving current via said respective common power supply line, and data lines extending over said pixel regions on the respective sides of said common power supply line.

10. The display device according to claim 9, further comprising an interconnection layer formed between the two data lines extending, across said pixel regions, on the sides of each of said common power supply lines.

11. The display device according to claim 1, a center-to-center pitch of the organic semiconductor film areas being equal in any of the pixel regions located along a direction parallel to a direction in which said scanning lines extend.

12. A display device comprising elements formed on a substrate, said elements including:
    a plurality of scanning lines;
    a plurality of data lines extending in a direction perpendicular to a direction in which said scanning lines extend;
    a plurality of common power supply lines extending in a direction parallel to said data lines;
    at least one of a first driving circuit for outputting an image signal over said data lines and a second driving circuit for outputting a scanning signal over said scanning lines; and
    pixel regions formed in the shape of a matrix defined by said data lines and said scanning lines, each of said pixel regions including:
        a first thin film transistor having a first gate electrode to which the scanning signal is supplied via one of the scanning lines;
        a holding capacitor for holding the image signal supplied from a corresponding data line via said first thin film transistor;
        a second thin film transistor having a second gate electrode to which said image signal held by said holding capacitor is supplied; and
        a luminescent element including an organic semiconductor film formed between a pixel electrode provided in each of said pixel regions and an opposite electrode extending across the data lines such that said opposite electrode faces the plurality of pixel electrodes, said luminescent element being adapted to emit light when said organic semiconductor film is driven by a driving current which flows between said pixel electrode and said opposite electrode when said pixel electrode is electrically connected to a corresponding common power supply line via said second thin film transistor, light emitting areas of said organic semiconductor film being surrounded by a bank layer made up of an insulating film having a thickness greater than that of said organic semiconductor film, said bank layer being formed such that said at least one of said driving circuits are covered with said bank layer.

13. The display device according to claim 12, said organic semiconductor film being formed by means of an ink-jet technique in the areas surrounded by said bank layer, and said bank layer being a water repellent film.

14. The display device according to claim 12, said organic semiconductor film being formed by means of an ink-jet technique in the areas surrounded by said bank layer, and said bank layer having a thickness equal to or greater than 1 μm.

15. The display device according to claim 12, an area of each said pixel electrode overlapping the corresponding first thin film transistor or second thin film transistor being covered with said bank layer.

16. The display device according to claim 12, said bank layer being formed of a black resist film.

17. The display device according to claim 12, a resistance of said common power supply lines per unit length being smaller than a resistance of said data lines per unit length.

18. The display device according to claim 12, said common power supply lines and said data lines being made of a same material and having a same thickness and a width of said common power supply lines being greater than a width of said data lines.

19. The display device according to claim 12, pixel regions located at both sides of each of said common power supply lines being supplied with said driving current via said respective common power supply line, and data lines extending over said pixel regions on the respective sides of said common power supply line.

20. The display device according to claim 19, further comprising an interconnection layer formed between the two data lines extending, across said pixel regions, on the sides of each of said common power supply lines.

21. The display device according to claim 12, a center-to-center pitch of the organic semiconductor film areas being equal in any of the pixel regions located along a direction parallel to a direction in which said scanning lines extend.

* * * * *

UNITED STATES PATENT AND TRADEMARK OFFICE
CERTIFICATE OF CORRECTION

PATENT NO. : 6,194,837 B1
DATED : February 27, 2001
INVENTOR(S) : Tokuroh Ozawa

It is certified that error appears in the above-identified patent and that said Letters Patent is hereby corrected as shown below:

Title page,
Line 54, change the title to -- DISPLAY DEVICE --

Signed and Sealed this

Twenty-third Day of October, 2001

Attest:

NICHOLAS P. GODICI
Attesting Officer
Acting Director of the United States Patent and Trademark Office

UNITED STATES PATENT AND TRADEMARK OFFICE
CERTIFICATE OF CORRECTION

PATENT NO. : 6,194,837 B1
APPLICATION NO. : 09/242927
DATED : February 27, 2001
INVENTOR(S) : Tokuroh Ozawa It is certified that error appears in the above-identified patent and that said Letters Patent is hereby corrected as shown below:

In claim 1,
    Col. 13, line 59, change "semiconductor film" to --semiconductor films--.
    Col. 13, line 61, change "that" to --those--.
    Col. 13, line 62, change "semiconductor film" to --semiconductor films--.
In claim 3,
    Col. 14, line 5, change "semiconductor film" to --semiconductor films--.
In claim 4,
    Col. 14, line 9, change "semiconductor film" to --semiconductor films--.
In claim 11,
    Col. 14, line 38, change "film areas" to --films--.
In claim 12,
    Col. 15, line 11, change "semiconductor film" to --semiconductor films--.
    Col. 15, line 13, change "that" to --those--.
    Col. 15, line 14, change "semiconductor film" to --semiconductor films--.
In claim 13,
    Col. 15, line 18, change "semiconductor film" to --semiconductor films--.
In claim 14,
    Col. 15, line 22, change "semiconductor film" to --semiconductor films--.
In claim 21,
    Col. 16, line 23, change "film areas" to --films--.

Signed and Sealed this

Twelfth Day of August, 2008

JON W. DUDAS
*Director of the United States Patent and Trademark Office*